(12) United States Patent
Grosse et al.

(10) Patent No.: US 10,180,373 B2
(45) Date of Patent: Jan. 15, 2019

(54) OPTO ELECTRICAL TEST MEASUREMENT SYSTEM FOR INTEGRATED PHOTONIC DEVICES AND CIRCUITS

(71) Applicant: STMicroelectronics (Crolles 2) SAS, Crolles (FR)

(72) Inventors: Philippe Grosse, Sassenage (FR); Patrick Le Maitre, Biviers (FR); Jean-Francois Carpentier, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/489,127

(22) Filed: Apr. 17, 2017

(65) Prior Publication Data

US 2017/0307687 A1 Oct. 26, 2017

Related U.S. Application Data

(63) Continuation-in-part of application No. 15/133,614, filed on Apr. 20, 2016, now Pat. No. 9,791,346.

(51) Int. Cl.
*G01M 11/02* (2006.01)
*G02B 6/28* (2006.01)
(Continued)

(52) U.S. Cl.
CPC ......... *G01M 11/02* (2013.01); *G01R 31/2656* (2013.01); *G01R 31/27* (2013.01);
(Continued)

(58) Field of Classification Search
CPC ........... G01M 11/3172; G01M 11/335; G01M 11/3127; G01M 11/3181; G01M 11/00; G01M 11/3163; G01M 11/331; G01M 11/336; G01M 11/02; G01M 11/083; G01M 11/30; G01M 11/31; G01M 11/33; G01M 11/35; G01N 24/10; G01N 21/6489; G01N 2201/0612; G01N 22/00; G01N 22/04; G01N 33/42; G01N 2021/845; G01N 21/21; G01N 21/55; G01N 21/64;
(Continued)

(56) References Cited

U.S. PATENT DOCUMENTS

2003/0184734 A1* 10/2003 Parente ................. G01M 11/30
356/73.1
2005/0062978 A1* 3/2005 Krause ............... G01D 5/35303
356/477

(Continued)

*Primary Examiner* — Michael P Stafira
(74) *Attorney, Agent, or Firm* — Crowe & Dunlevy

(57) ABSTRACT

An optical testing circuit on a wafer includes an optical input configured to receive an optical test signal and photodetectors configured to generate corresponding electrical signals in response to optical processing of the optical test signal through the optical testing circuit. The electrical signals are simultaneously sensed by a probe circuit and then processed. In one process, test data from the electrical signals is simultaneously generated at each step of a sweep in wavelength of the optical test signal and output in response to a step change. In another process, the electrical signals are sequentially selected and the sweep in wavelength of the optical test signal is performed for each selected electrical signal to generate the test data.

19 Claims, 8 Drawing Sheets

(51) Int. Cl.

| | |
|---|---|
| *G02B 6/34* | (2006.01) |
| *G02B 6/12* | (2006.01) |
| *G01R 31/265* | (2006.01) |
| *G01R 31/27* | (2006.01) |
| *G01R 31/28* | (2006.01) |
| *G01R 31/303* | (2006.01) |
| *G01R 31/311* | (2006.01) |
| *G01R 31/317* | (2006.01) |
| *G01R 35/00* | (2006.01) |
| *G02B 6/00* | (2006.01) |

(52) U.S. Cl.
CPC ....... *G01R 31/2884* (2013.01); *G01R 31/303* (2013.01); *G01R 31/311* (2013.01); *G01R 31/31728* (2013.01); *G01R 35/00* (2013.01); *G02B 6/00* (2013.01); *G02B 6/12004* (2013.01); *G02B 6/2808* (2013.01); *G02B 6/34* (2013.01)

(58) Field of Classification Search
CPC ........... G01N 21/8901; G01N 21/9501; G01N 21/95684; G01N 2201/0635; G01N 33/38; G01N 2021/556; G01N 21/274; G01N 21/314; G01N 21/33; G01N 21/3581; G01N 21/4795; G01N 21/59; G01N 21/6458; G01N 2201/061; G01N 2201/0627; G01N 2201/0691; G01N 2291/0258; G01N 2291/056; G01N 2291/102; G01N 2291/106; G01N 27/3272; G01N 27/72; G01N 29/221; G01N 29/2418; G01N 29/2431; G01N 29/28; G01N 29/32; G01N 29/343; G01N 29/46; G01N 33/246; G01N 9/24; G02B 6/34; G02B 13/22; G02B 26/0841; G02B 6/00; G02B 6/124; G02B 6/4222; G02B 6/4225; G02B 6/4227; G02B 6/4249; G02B 6/425; G02B 7/182; G02B 7/1821; G02B 21/002; G02B 21/0092; G02B 6/02042; G02B 6/022; G02B 6/02285; G02B 6/0288; G02B 6/12004; G02B 6/12007; G02B 6/138; G02B 6/2808; G02B 6/385; G02B 6/4403; G02B 6/4405; G02B 6/441; G02B 6/4413; G02B 6/4427

See application file for complete search history.

(56) References Cited

U.S. PATENT DOCUMENTS

| | | | |
|---|---|---|---|
| 2013/0046499 A1* | 2/2013 | Minneman | G01M 11/3127 702/85 |
| 2014/0336973 A1* | 11/2014 | Froggatt | G01B 9/02004 702/104 |
| 2016/0266005 A1* | 9/2016 | Bos | G01M 11/3127 |

* cited by examiner

OPTO ELECTRICAL TEST MEASUREMENT SYSTEM FOR INTEGRATED PHOTONIC DEVICES AND CIRCUITS

CROSS-REFERENCE TO RELATED APPLICATION

This application is a continuation-in-part of U.S. application patent Ser. No. 15/133,614 filed Apr. 20, 2016, the disclosure of which is incorporated by reference.

TECHNICAL FIELD

The present disclosure relates to the field of photonics, and, more particularly, to optical measurement of photonic devices and circuits.

BACKGROUND

Integrated optical devices (for example, photonic integrated circuits) for directly processing optical signals have become of greater importance as optical fiber communications increasingly replace metallic cable and microwave transmission links. Integrated optical devices can advantageously be implemented as silicon optical circuits having compact dimensions at relatively low cost. Silicon optical circuits employ integrated waveguide structures formed in a silicon layer of a silicon-on-insulator (SOI) substrate, forming a silicon photonic chip.

In some applications, the optical signal is injected in/extracted from the photonic chip in a near perpendicular fashion, with respect to the photonic chip substrate plane, by way of an optical coupler (for example, a grating coupler) formed in the silicon photonic chip for input-output of the photonic signal. When using the silicon substrate in such a coupling fashion, such as when coupling to an optical fiber, the optical fiber is mounted in near perpendicular fashion.

During manufacture of integrated optical devices, a large number of integrated optical devices are fabricated on a typical semiconductor wafer. As part of a rigorous manufacturing process, it may be helpful to measure optical loss or spectral response for quality control at the wafer level. Since optical loss in individual optical components is relatively low (for example, on the order of 0.015 dB per component), testing for loss is typically performed on a special purpose test structure (i.e., the test structure will not be functional for the customer) comprising a plurality of optical components daisy chained together to define a testing (reference) circuit. During testing, a known/reference optical input is injected into the test structure and the optical output is measured for comparison to the known/reference optical input. The overall loss of the testing circuit is determined and divided by the number of test optical devices included therein to determine an average device loss. If the determined loss is outside an acceptable range, the wafer is considered defective and removed from the manufacturing process.

One potential issue with testing individual devices at the wafer level is that optical inputs and outputs must be precisely aligned to accurately measure device loss. This alignment issue is worsened when an optical fiber array needs to be aligned with multiple outputs (due to the intrinsic misalignment within the array). This may cause the testing process to be quite long and difficult. Since this testing is done at the wafer level before singulation, this laborious effort could grow geometrically if each wafer includes multiple testing circuits. Indeed, this task can be exhaustive when each IC within a wafer includes a testing circuit.

There is a need for a better method of testing and associated supporting test apparatus.

SUMMARY

In an embodiment, a method is presented for testing an optical testing circuit on a wafer, wherein said optical testing circuit includes: an optical input configured to receive an optical test signal and a plurality of photodetectors configured to generate a corresponding plurality of electrical signals in response to optical processing of said optical test signal through the optical testing circuit. The method comprises: applying the optical test signal with a sweep in wavelength; simultaneously sensing the plurality of electrical signals at each step of the sweep in wavelength; generating test data for the simultaneously sensed plurality of electrical signals at each step of the sweep in wavelength; storing the test data at each step of the sweep in wavelength; sensing a change in wavelength of the optical test signal; and in response to the sensed change in wavelength of the optical test signal, outputting the stored test data.

In an embodiment, a system is presented for testing an optical testing circuit on a wafer, wherein said optical testing circuit includes: an optical input configured to receive an optical test signal and a plurality of photodetectors configured to generate a corresponding plurality of electrical signals in response to optical processing of said optical test signal through the optical testing circuit. The system comprises: a light source configured to apply the optical test signal with a sweep in wavelength; a probe card configured to simultaneously sense the plurality of electrical signals at each step of the sweep in wavelength; a conversion circuit configured to generate test data for the simultaneously sensed plurality of electrical signals at each step of the sweep in wavelength and store the test data at each step of the sweep in wavelength; a power meter configured to sense a change in wavelength of the optical test signal; and a control circuit configured to respond to the sensed change in wavelength of the optical test signal by reading the stored test data from the conversion circuit.

In an embodiment, a method is presented for testing an optical testing circuit on a wafer, wherein said optical testing circuit includes: an optical input configured to receive an optical test signal and a plurality of photodetectors configured to generate a corresponding plurality of electrical signals in response to optical processing of said optical test signal through the optical testing circuit. The method comprises: applying the optical test signal with a sweep in wavelength; and at each step of the sweep in wavelength, performing a process as follows: sequentially selecting an electrical signal from the plurality of electrical signals; and for each selected electrical signal, performing a process as follows: sweeping the wavelength of the optical test signal; sensing the selected electrical signal; generating test data from the selected electrical signal over the sweep in wavelength of the optical test signal; determining whether all electrical signals of the plurality of electrical signals have been selected; and if not, then changing the selected electrical signal and repeating the process.

In an embodiment, a system is provided for testing an optical testing circuit on a wafer, wherein said optical testing circuit includes: an optical input configured to receive an optical test signal and a plurality of photodetectors configured to generate a corresponding plurality of electrical signals in response to optical processing of said optical test signal through the optical testing circuit. The system comprises: a light source configured to apply the optical test signal; a probe card configured to simultaneously sense the plurality of electrical signals at each step of the sweep in wavelength; a multiplexer circuit configured to sequentially select each electrical signal of the plurality of electrical signals; a meter circuit configured to convert each selected electrical signal to generate test data for output; and a control circuit configured to control the sequential selection by the multiplexer circuit so that each electrical signal of the plurality of electrical signals is selected and further control the light source to perform a sweep in wavelength of the optical test signal for each selected electrical signal.

BRIEF DESCRIPTION OF THE DRAWINGS

One or more embodiments will now be described, by way of example only, with reference to the annexed drawings, in which.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Figure 1:
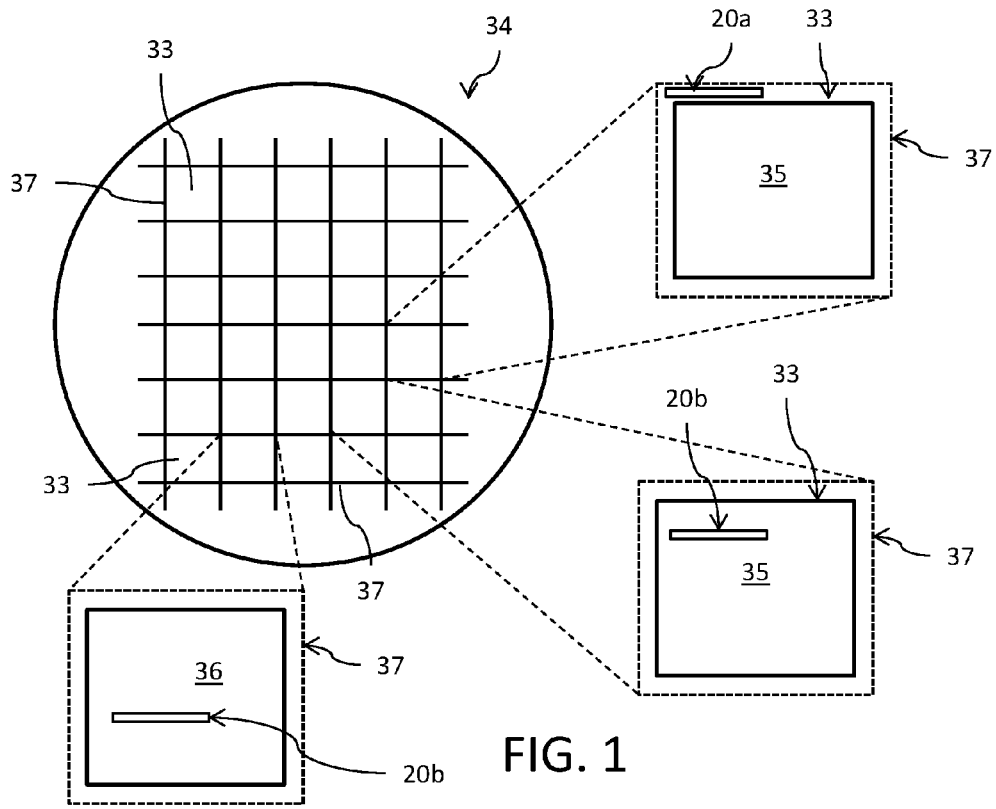
FIG. 1 shows a semiconductor wafer.

FIG. 1 schematically shows a semiconductor wafer 34. The semiconductor wafer 34 may comprise, for example, a silicon wafer or silicon on insulator (SOI) wafer, that includes a plurality of integrated circuit chips 33, fabricated using well known processes, therein. The chips 33 are delimited from each other by scribe lines 37. Each chip 33 includes other circuitry 35, which represents functional circuitry for use after singulation.

A testing circuit 20a is carried by the semiconductor wafer 34 within the scribe line 37. In this embodiment, the testing circuit 20a is removed/destroyed by the singulation process which dices the semiconductor wafer 34 to individually release the plurality of chips 33 included therein. In the illustrated embodiment, only one testing circuit 20a is shown in the scribe line 37 for the wafer. This is by example only, as multiple testing circuits 20a can be distributed over the wafer 34 at various locations as needed or desired. In other embodiments, a plurality of testing circuits 20a may be provided in the scribe lines surrounding the circuitry 35 for one chip 33; for example, two reference circuits at opposing sides of a respective circuit 35 for a chip 33.

In other embodiments, a testing circuit 20b may instead be located beyond the plurality of scribe lines; i.e., the testing circuit 20b remains within the chip 33, perhaps as part of the functional circuitry 35, after singulation. In the illustrated embodiment, only one testing circuit 20b is shown within the chip 33. This is by example only, as multiple testing circuits 20b can be distributed within a single chip 33 as needed or desired.

In some embodiments, the semiconductor wafer 34 can include one or more test chips (TC) that comprise the testing circuit 20b. Such test chips TCs may include other testing circuitry 36 as well. In the illustrated embodiment, only one testing circuit 20b is shown within the test chip TC. This is by example only, as multiple testing circuits 20b can be distributed within a single test chip TC as needed or desired.

A testing circuit 20 (encompassing either of the testing circuits 20a, 20b) is used in the testing of the wafer 34. The number of testing circuits 20 and their positioning on the wafer is dictated by the wafer design and the type of testing to be performed. In situations where that testing by the testing circuit 20 indicates presence of a defect, the wafer may be discarded prior to the singulation operation and the subsequent packaging of the individual chips 33. Alternatively, the individual chips 33 whose testing circuit 20 indicates presence of a defect can be discarded after singulation and sorting.

Figure 2:
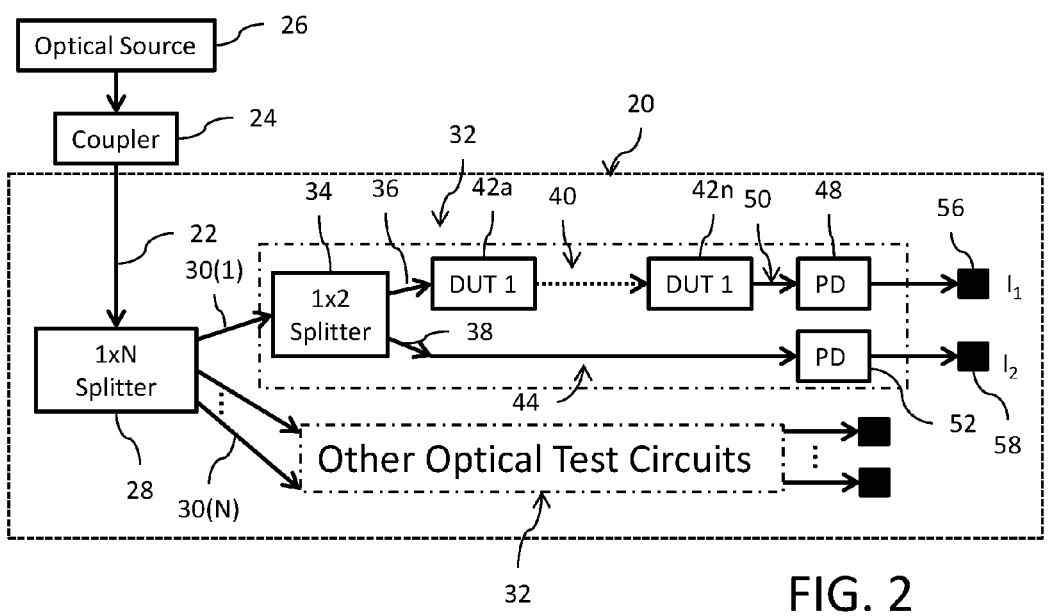
FIG. 2 is a block diagram of a testing circuit.

Reference is now made to FIG. 2 showing a block diagram of an embodiment for the testing circuit 20. The testing circuit 20 receives an optical test signal 22 from an optical coupler 24 positioned on the wafer. The optical coupler 24 receives the optical test signal 22 from an optical source 26 (for example, a laser optical source) external to the wafer. The optical coupler 24 may, for example, comprise an optical grating coupler (for example, a single polarization grating coupler—SPGC). The optical test signal 22 is received at an input of an optical splitter 28. In this implementation, the optical splitter 28 performs a 1×N split of the optical test signal 22 to generate N optical test signals 30(1)-30(N) for application to one or more included optical test circuits 32.

Details of an example optical test circuit 32 are shown in FIG. 2. The optical test signal 30(1) is received at an input of a 1×2 balanced or calibrated optical splitter 34. The optical splitter 34 performs a 1×2 split of the optical test signal 30(1) to generate a testing optical test signal 36 and a reference optical test signal 38. The testing optical test signal 36 is applied to a test channel 40 formed by a plurality of optical device under test (DUT) circuits (DUT 1) 42a-42n coupled in a daisy chain configuration (i.e., in series) between the input of the test channel 40 and the output of the test channel 40. The reference optical test signal 38 is applied to the input of a reference channel 44. The reference channel 44 is configured to not include DUT circuits.

The DUT circuits 42a-42n are, for example, representative of, or perhaps replicas of, optical circuits forming at least part of the functional circuitry 35. In this regard, those skilled in the art understand that testing of the optical DUT circuits 42 in the testing channel 40 will provide information concerning the operation of the corresponding optical circuits of the functional circuitry 35; wherein failure of the optical DUT circuits 42 in the test channel 40 would indicate a likelihood that the corresponding optical circuits of the functional circuitry are similarly flawed.

Each optical DUT circuit 42 may comprise, for example, one of an optical waveguide, or an optical modulator component, such as a meandering optical waveguide. The test channel 40 may be formed of optical DUT circuits 42 a single respective device type; for example, the test channel includes only optical waveguides in daisy chain connection. Alternatively, the test channel 40 may be formed of optical DUT circuits 42 of different respective device types; for example, the test channel includes an optical waveguide in daisy chain connection with an optical modulator. The embodiment shown by example in FIG. 2 shows that that test channel 40 includes DUT circuits 42 of a single same type referred to as DUT 1.

The testing circuit 20 further includes a first photodetector (PD) 48 coupled to receive an optical test output signal 50 from the output of the test channel 40 and a second photodetector 52 coupled to receive the reference optical test signal 38 output from the reference channel 44. The first and second photodetectors 48 and 52 may, for example, each be formed by a photodiode. The testing circuit 20 further includes a first electrical output terminal 56 coupled to the first photodetector 48 and a second electrical output terminal 58 coupled to the second photodetector 52. Electrical signals $I_1$ and $I_2$ are output from the first and second electrical output terminals 56 and 58, respectively, with those electrical signals being indicative of the optical test output signal 50 and the reference optical test signal 38 detected, respectively, by the photodetectors 48 and 52.

FIGS. 3A-3D show example configurations for other optical test circuits 32 that could be used within the testing circuit 20 of FIG. 2. The testing circuit 20 may include one or more of each optical test circuit 32 as needed to effectuate a desired optical testing protocol.

Figure 3A:
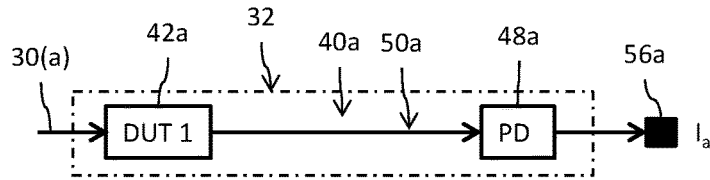
FIGS. 3A-3D show examples of optical test circuits for inclusion within the testing circuit of FIG. 2.

FIG. 3A shows an optical test circuit 32 with a test channel 40a that includes a single optical DUT circuit 42a that receives one of the optical test signals 30(a) and outputs an optical test output signal 50a to a photodetector (PD) 48a. An electrical output terminal 56a is coupled to the photodetector 48a. An electrical signal $I_a$ is output from the electrical output terminal 56a, with that electrical signal being indicative of the optical test output signal 50a detected by the photodetector 48a.

The DUT circuit 42a is, for example, representative of, or perhaps a replica of, an optical circuit forming at least part of the functional circuitry 35. In this regard, those skilled in the art understand that testing of the optical DUT circuit 42a in the testing channel 40a will provide information concerning the operation of the corresponding optical circuits of the functional circuitry 35; wherein failure of the optical DUT circuit 42a in the testing channel 40a would indicate a likelihood that the corresponding optical circuits of the functional circuitry are similarly flawed. The optical DUT circuit 42a may comprise, for example, one of an optical waveguide, or an optical modulator component, such as a meandering optical waveguide.

Figure 3B:
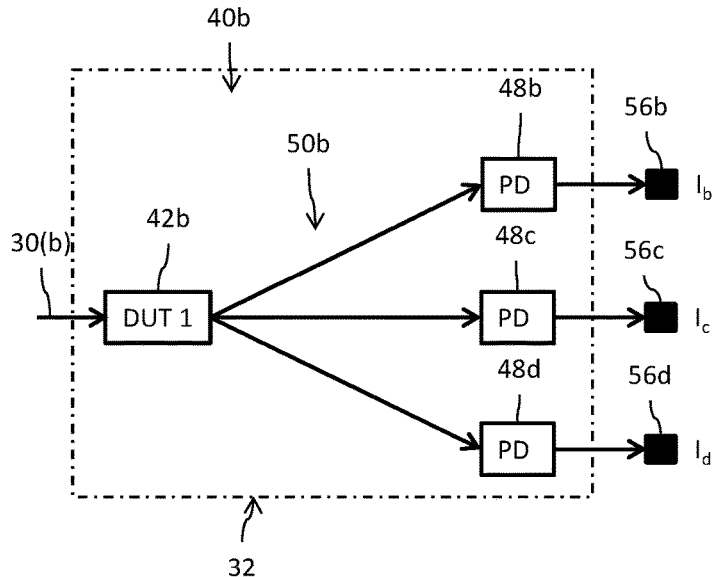

FIG. 3B shows an optical test circuit 32 with a test channel 40b that includes a single optical DUT circuit 42b that receives one of the optical test signals 30(b) and outputs an optical test output signal 50b to a plurality of photodetectors (PD) 48b-48d. Corresponding electrical output terminals 56b-56d are coupled to the photodetectors 48b-48d. Electrical signals $I_b$-$I_d$ are output from the electrical output terminals 56b-56d, with those electrical signals being indicative of the optical test output signal 50b detected by the photodetectors 48b-48d.

The DUT circuit 42b is, for example, representative of, or perhaps a replica of, an optical circuit forming at least part of the functional circuitry 35. In this regard, those skilled in the art understand that testing of the optical DUT circuit 42b in the testing channel 40b will provide information concerning the operation of the corresponding optical circuits of the functional circuitry 35; wherein failure of the optical DUT circuit 42b in the testing channel 40b would indicate a likelihood that the corresponding optical circuits of the functional circuitry are similarly flawed. The optical DUT circuit 42b may comprise, for example, one of an optical waveguide, or an optical modulator component, such as a meandering optical waveguide.

Figure 3C:
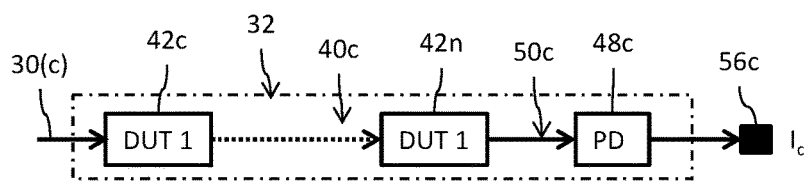

FIG. 3C shows an optical test circuit 32 with a test channel 40c that includes a plurality of optical DUT circuits 42c-42n coupled in a daisy chain configuration (i.e., in series) between the input of the test channel 40c and the output of the test channel 40c. The test channel 40c receives one of the optical test signals 30(c) and outputs an optical test output signal 50c to a photodetector (PD) 48c. An electrical output terminal 56c is coupled to the photodetector 48c. An electrical signal $I_c$ is output from the electrical output terminal 56c, with that electrical signal being indicative of the optical test output signal 50c detected by the photodetector 48c.

The DUT circuits 42c-42n are, for example, representative of, or perhaps a replica of, optical circuits forming at least part of the functional circuitry 35. In this regard, those skilled in the art understand that testing of the optical DUT circuits 42c-42n in the testing channel 40c will provide information concerning the operation of the corresponding optical circuits of the functional circuitry 35; wherein failure of the optical DUT circuits 42c-42n in the testing channel 40c would indicate a likelihood that the corresponding optical circuits of the functional circuitry are similarly flawed. The optical DUT circuits 42c-42n may each comprise, for example, an optical waveguide, or an optical modulator component, such as a meandering optical waveguide.

Figure 3D:
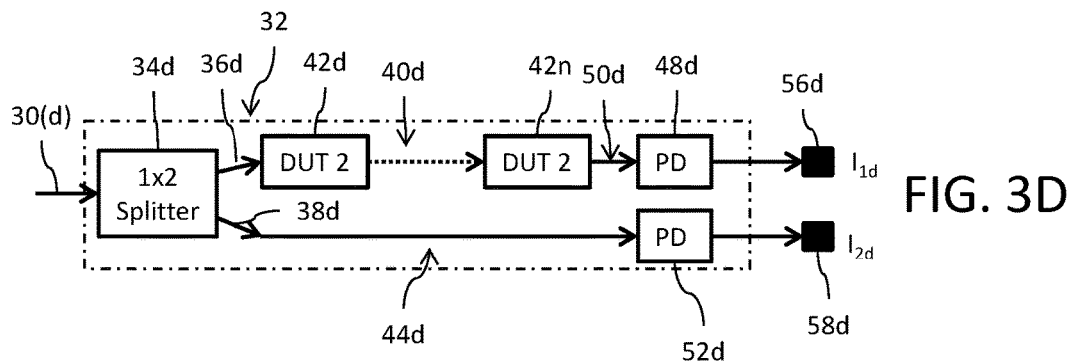
Figure 4A:
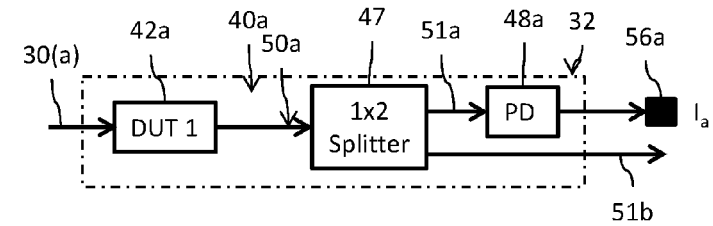
FIGS. 4A-4D show examples of optical test circuits for inclusion within the testing circuit of FIG. 2.
Figure 4B:
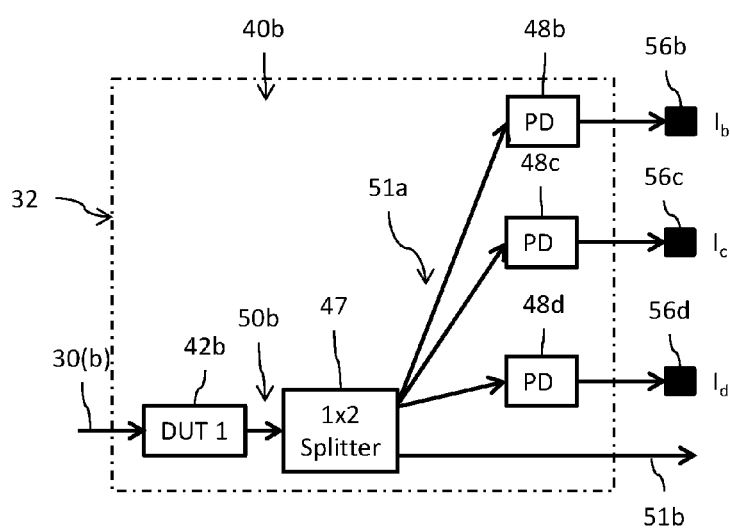
Figure 4C:
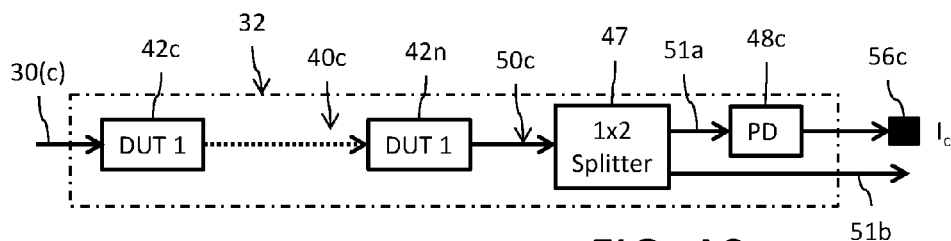
Figure 4D:
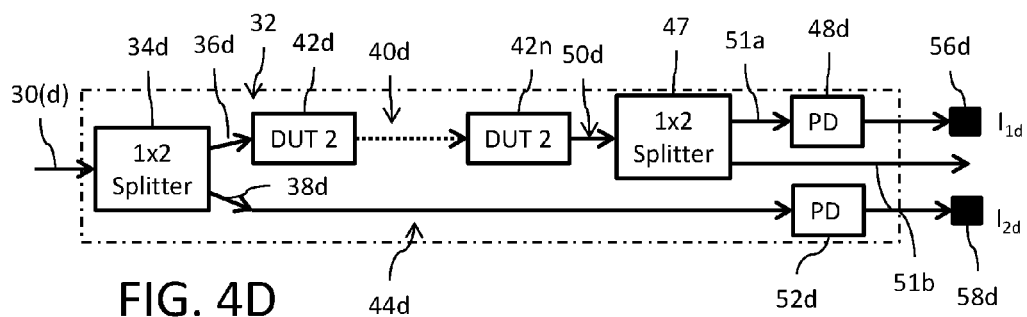

FIG. 3D shows an optical test circuit 32 with a test channel 40d and a reference channel 44d. The optical test signal 30(d) is received at an input of a 1×2 balanced or calibrated optical splitter 34d. The optical splitter 34d performs a 1×2 split of the optical test signal 30(d) to generate a testing optical test signal 36d for application to the test channel 40d and a reference optical test signal 38d for application to the reference channel 44d. The test channel 40d includes a plurality of optical DUT circuits 42d-42n coupled in a daisy chain configuration (i.e., in series) between the input of the test channel 40c and the output of the test channel 40c. Here, it will be noted that a different type of DUT circuit, referred to as DUT 2, is being tested in this test channel. The test channel 40d receives the testing optical test signal 36d and outputs an optical test output signal 50d to a photodetector (PD) 48d. An electrical output terminal 56d is coupled to the photodetector 48d. An electrical signal $I_{1d}$ is output from the electrical output terminal 56d, with that electrical signal being indicative of the optical test output signal 50d detected by the photodetector 48d. A photodector (PD) 52d receives the reference optical test signal 38d. An electrical output terminal 58d is coupled to the photodetector 52d. An electrical signal $I_{2d}$ is output from the electrical output terminal 58d, with that electrical signal being indicative of the reference optical test signal 38d detected by the photodetector 52d.

The DUT circuits 42d-42n are, for example, representative of, or perhaps a replica of, optical circuits forming at least part of the functional circuitry 35. In this regard, those skilled in the art understand that testing of the optical DUT circuits 42d-42n in the testing channel 40d will provide information concerning the operation of the corresponding optical circuits of the functional circuitry 35; wherein failure of the optical DUT circuits 42d-42n in the testing channel 40d would indicate a likelihood that the corresponding optical circuits of the functional circuitry are similarly flawed. The optical DUT circuits 42d-42n may each comprise, for example, an optical waveguide, or an optical modulator component, such as a meandering optical waveguide.

FIGS. 4A-4D show alternative embodiments for the optical test circuits 32 shown in FIGS. 3A-3D. Like reference numbers refer to like or similar parts. The embodiments of FIGS. 4A-4D differ from the embodiments of FIGS. 3A-3D by further including, within each test channel 40, a 1×2 optical splitter 47 that splits the optical test output signals 50 into a first optical signal 51a and second optical signal 51b. The first optical signal 51a is detected by the corresponding photodetector 48, while the second optical signal 51b is output from the optical test circuit 32.

Figure 5:
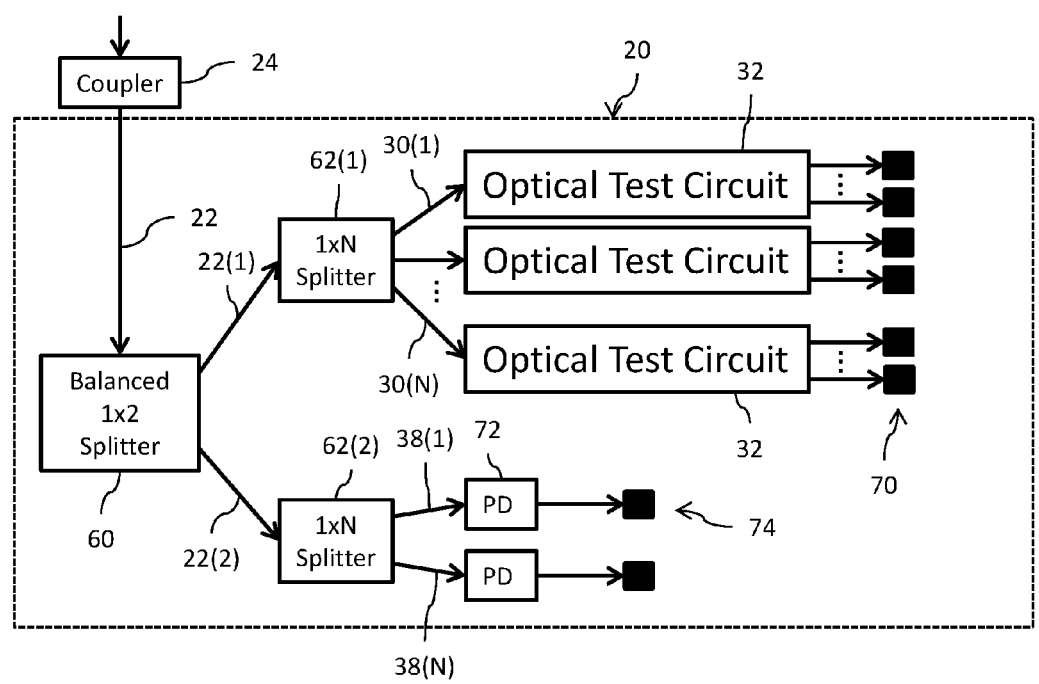
FIG. 5 is a block diagram of an embodiment of a testing circuit.

FIG. 5 shows a block diagram of an embodiment for the testing circuit 20 wherein the optical test signal 22 received from the optical coupler 24 is applied to an input of a 1×2 balanced or calibrated optical splitter 60. The optical splitter 60 performs a 1×2 split of the optical test signal 22 to generate a first optical test signal 22(1) and a second optical test signal 22(2). The first optical test signal 22(1) is applied to a first optical splitter 62(1) which performs a 1×N split of the first optical test signal 22(1) to generate N optical test signals 30(1)-30(N) for application to one or more included optical test circuits 32. The test circuits 32 may, for example, comprises selected ones of the circuits shown in FIGS. 2, 3A-3D and 4A-4D. Electrical signals from the photodetectors within the test circuits 32 are provided at corresponding electrical output terminals 70. The second optical test signal 22(2) is applied to a second optical splitter 62(2) which performs a 1×N split of the second optical test signal 22(2) to generate N optical reference signals 38(1)-38(N) that are detected by photodetectors 72. Electrical signals from photodetectors 72 are provided at corresponding electrical output terminals 74.

Figure 6:
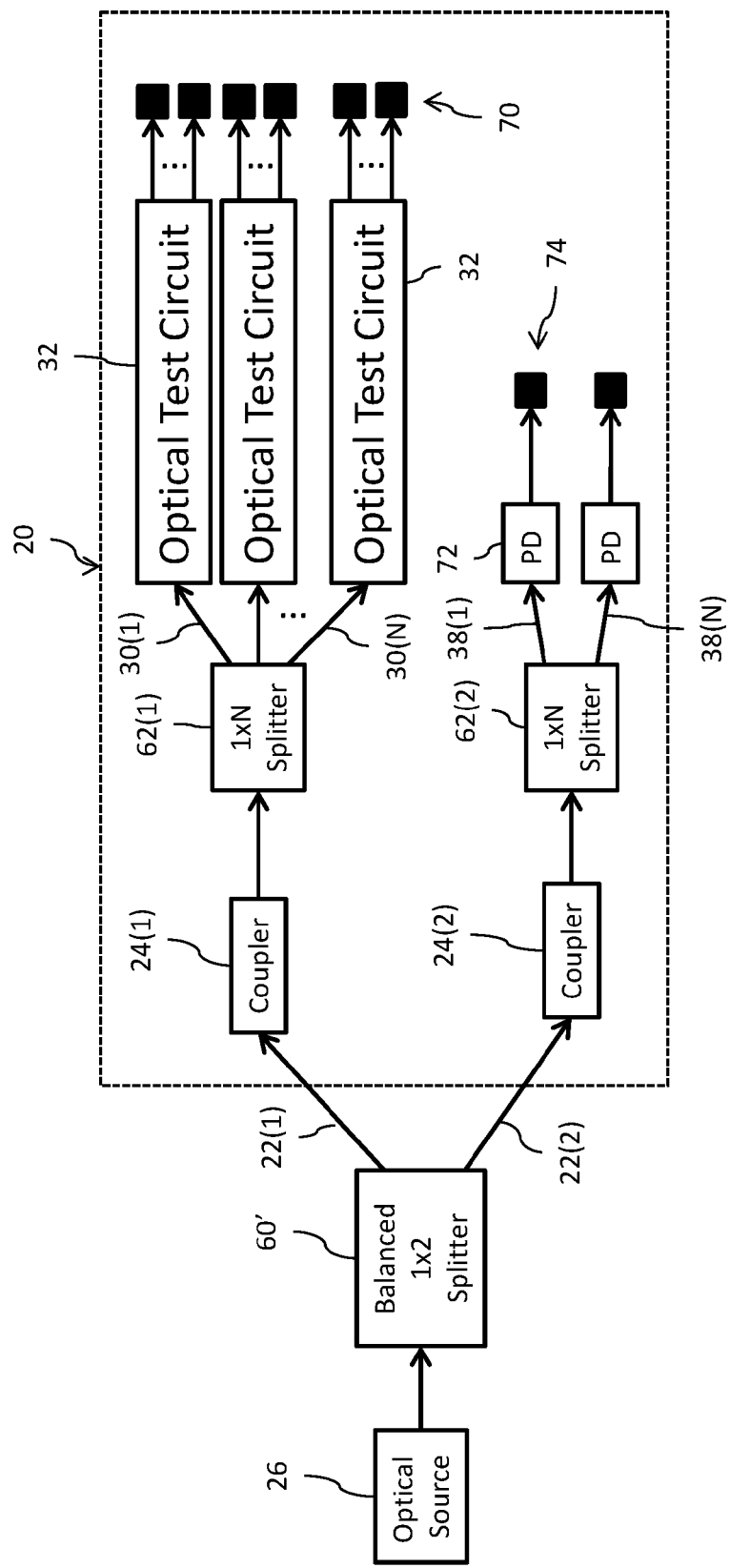
FIG. 6 is a block diagram of an embodiment of a testing circuit.

Reference is now made to FIG. 6 which shows a block diagram of an embodiment for the testing circuit 20 wherein the optical test signal 22 generated by the optical source 26 is split by a 1×2 balanced or calibrated optical splitter 60' to generate a first optical test signal 22(1) and a second optical test signal 22(2). The first optical test signal 22(1) is received by a first optical coupler 24(1) and applied to a first optical splitter 62(1) which performs a 1×N split of the first optical test signal 22(1) to generate N optical test signals 30(1)-30(N) for application to one or more included optical test circuits 32. The test circuits 32 may, for example, comprises selected ones of the circuits shown in FIGS. 2, 3A-3D and 4A-4D. Electrical signals from the photodetectors within the test circuits 32 are provided at corresponding electrical output terminals 70. The second optical test signal 22(2) is received by a second optical coupler 24(2) and applied to a second optical splitter 62(2) which performs a 1×N split of the second optical test signal 22(2) to generate N optical reference signals 38(1)-38(N) that are detected by photodetectors 72. Electrical signals from photodetectors 72 are provided at corresponding electrical output terminals 74.

As an alternative to use of a balanced optical splitter 60, the optical splitter may instead have a split ratio that is known (calibrated) based on wavelength. Furthermore, as an alternative to use of a balanced optical splitter 60, the optical splitter may instead comprise an optical switch. The optical splitter 60' in the FIG. 6 embodiment is located off the wafer, while the optical splitter 60 in the FIG. 5 embodiment is located on the wafer.

Figure 7:
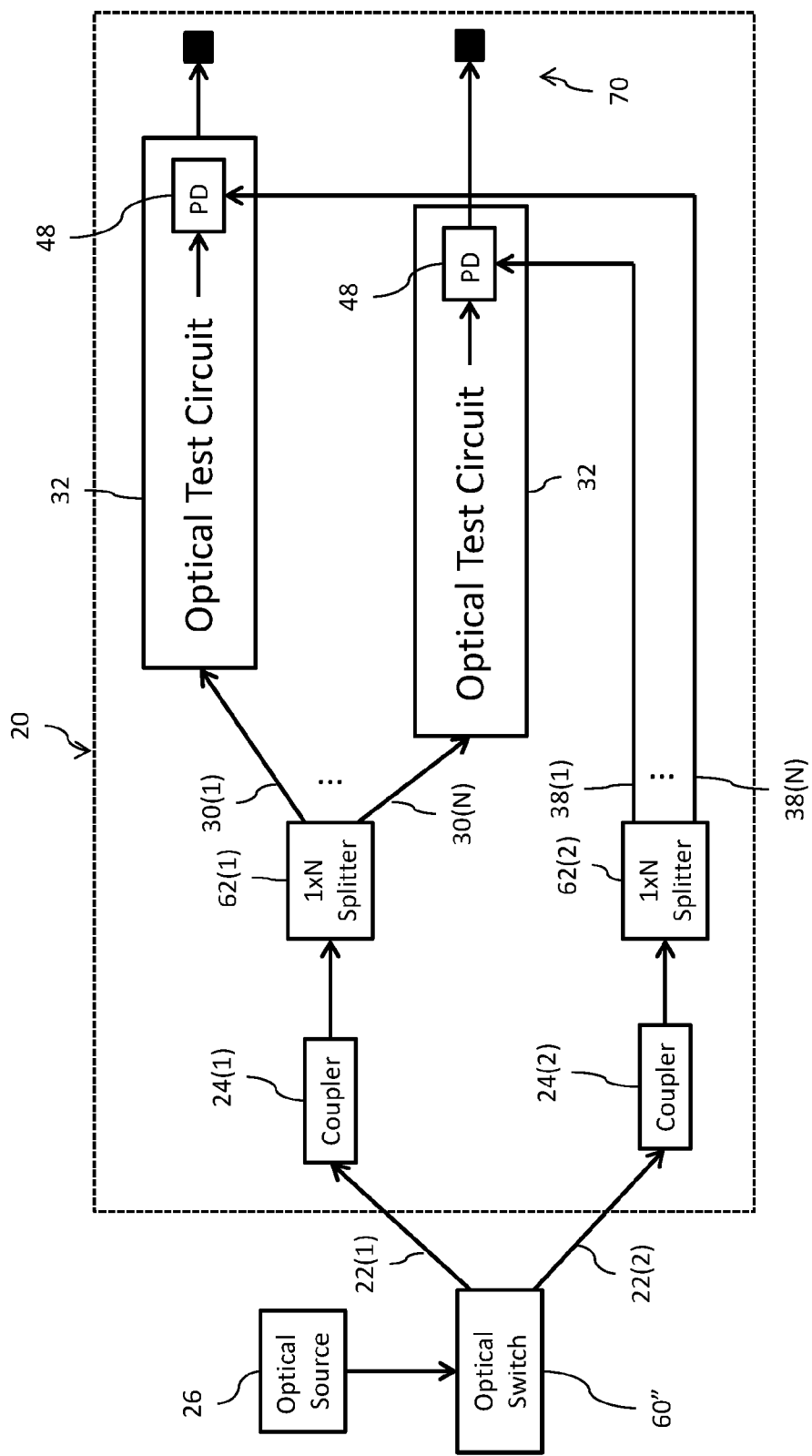
FIG. 7 is a block diagram of an embodiment of a testing circuit.

Reference is now made to FIG. 7 which shows a block diagram of an embodiment for the testing circuit 20. Like reference numbers refer to like or similar parts. The embodiment of FIG. 7 differs from previously described embodiments in the shared use of photodetectors 48 within each optical test circuit 32 for processing both the optical test signals 30(1)-30(N) and the optical reference signals 38(1)-38(N). In this embodiment, an optical switch 60" is used to split the optical test signal 22 generated by the optical source 26 to generate a first optical test signal 22(1) and a second optical test signal 22(2). With use of an optical switch, only one of the first optical test signal 22(1) or second optical test signal 22(2) is applied to the testing circuit 20 at a time, and thus the electrical signals output from the electrical output terminals 70 can be distinguished as relating to detection of the optical test signals 30(1)-30(N) or detection of the optical reference signals 38(1)-38(N).

Figure 8:
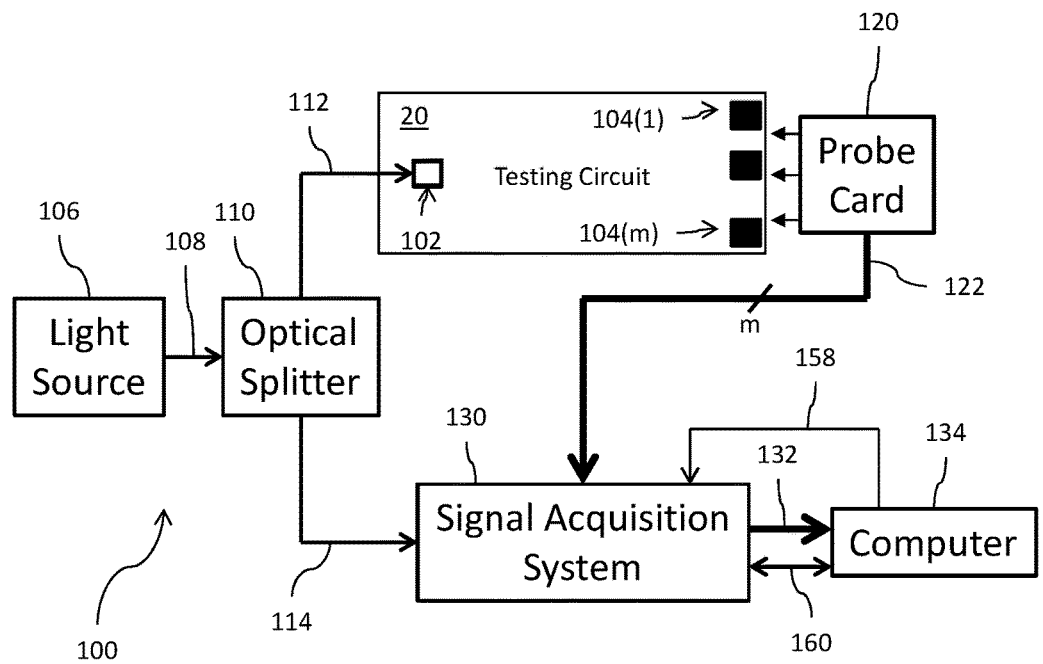
FIG. 8 is a block diagram of an opto-electrical test measurement system using the reference circuit.

Reference is now made to FIG. 8 showing an optoelectrical test measurement system 100 using the testing circuit 20. The testing circuit 20 may comprise any one of the embodiments shown herein with reference to FIGS. 2, 3A-3D, 4A-4D, 5, 6 and 7, fabricated on a wafer at any desired location as described herein with reference to FIG. 1. The testing circuit includes an optical input 102 and a plurality of electrical outputs 104(1)-104(m) for electrical signals (such as current signals output by photodetectors). The optical input 102 comprises, for example, one or more optical couplers as described herein. The plurality of electrical outputs 104(1)-104(m) comprise, for example, the electrical output terminals as described herein. In a preferred implementation, the plurality of electrical outputs 104(1)-104(m) are implemented by electrical pads on the wafer 34 that can be probed using test equipment well known to those skilled in the art to obtain the electrical signals.

An optical source 106 (for example, a continuous wave laser light source) generates an optical signal 108. An optical splitter 110 receives the optical signal 108 and splits the received optical signal into an optical testing signal 112 and an optical reference signal 114. The optical testing signal 112 comprises the optical test signal 22 as previously described herein. The optical testing signal 112 is applied to the optical input 102. The testing circuit 20 produces a plurality of electrical (i.e., photocurrent) signals at the plurality of electrical outputs 104(1)-104(m) in response to processing of the optical testing signal 112 through the reference circuit 20 in the manner described herein in connection with FIGS. 2, 3A-3D, 4A-4D, 5, 6 and 7.

An electrical probe apparatus 120 (for example, in the form of a probe card well known to those skilled in the art for use in wafer probing for test) is electrically coupled to the pads forming the plurality of electrical outputs 104(1)-104(m) to obtain the plurality of electrical (photocurrent) signals and provide a corresponding plurality of output signals 122.

A signal acquisition system 130 is coupled to receive the optical reference signal 114 at an optical input and is further coupled to receive the output signals 122 at a plurality of electrical inputs. The signal acquisition system 130 processes the optical reference signal 114 and the output signals 122 to generate test data 132 for output to a data processing computer 134. The signal acquisition system 130 operates to detect the wavelength of the reference signal 114, and measure the current of the output signals 122 from the testing circuit 20. The signal acquisition system 130 may further operate to control the optical source 106.

The signal acquisition system 130 may be in further communication with the computer 134 over a data bus 160 (for example, a Universal Serial Bus (USB)). The computer 134 controls operation of the signal acquisition system 130 through the control information 158 and receives data output from the signal acquisition system 130. The control information 158 is provided to instruct the signal acquisition system 130 operation for setting the start wavelength and the stop wavelength of the optical signal 108 generated by the optical source 106, the optical power of the optical signal 108, the speed of a sweep of the optical signal 108 between the start/stop wavelengths, and an identification of the number of data points to capture over that sweep. The received data is stored by the computer 134 in a readable memory for later analysis. The computer 134 may also directly compute the relevant data in function of the device tested: for instance loss of device computed from DUT and reference diode measurement.

Figure 9:
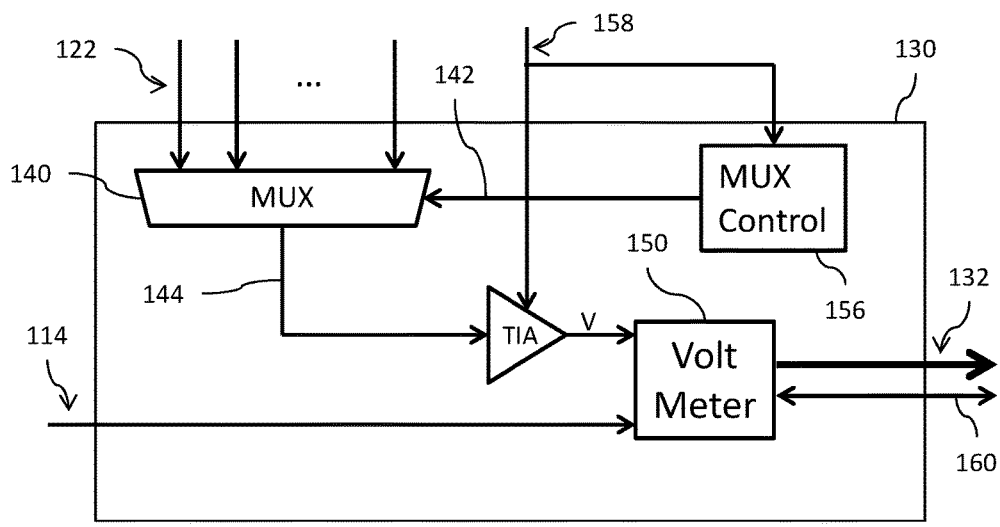
FIG. 9 is a block diagram of the signal acquisition system.

Reference is now made to FIG. 9 showing a block diagram of the signal acquisition system 130. The signal acquisition system 130 receives the optical reference signal 114 at the optical input and receives the output signals 122 at the plurality of electrical inputs. The plurality of electrical inputs are coupled to inputs of a multiplexer circuit (MUX) 140 (or electromechanical switch circuit). The multiplexer circuit 140 receives a control signal 142 that specifies a selection of one of the electrical inputs 122 for output as signal 144. A transimpedance amplifier (TIA) 146 receives the signal 144 and outputs an amplified signal 148 to a first input of a voltmeter 150. More particularly, the TIA 146 converts the current signal sensed from the electrical output 104 and selected by the MUX 140 to a voltage V. The operational parameters (gain, offset, etc.) of the TIA 146 are controlled by the control information 158 provided by the data processing computer 134. A second input of the voltmeter 150 is coupled to the optical input to receive the optical reference signal 114. The voltmeter 150 functions to measure the electrical voltages relating to the signal 114 at each step of the sweep of the wavelength of the optical reference signal 114. The voltmeter 150 accordingly senses a change in wavelength of the optical reference signal 114 during the sweep and makes the voltage measurement at each change in wavelength. The measured voltages are output to the data processing computer 134 (FIG. 7) as the test data 132 at each change in wavelength. The control signals 142 are generated by a MUX controller 156 in response to the control information 158 provided by the data processing computer 134. The MUX controller 156 functions to specify the selection of one of the electrical inputs 122 for output as signal 144 response to data processing computer 134 instruction.

Operation of the opto-electrical test measurement system 100 using the signal acquisition system 130 of FIG. 9 is as follows: a) the test equipment is coupled to the wafer and in particular to the reference circuit 20 (this involves optically coupling the optical testing signal 112 to the optical coupler 24 at the optical input 102, and electrically coupling the probe card 120 to the plurality of electrical outputs 104(1)-104(m); proper optical alignment is important); b) the control signal 142 output from the MUX controller 156 in response to signal 158 controls the MUX 140 to select one of the output signals 122; c) the signal 158 further adapts the gain of the TIA 146 in order ensure that the signal 148 for the selected output signal 122 remains within the operating range of voltmeter 150; d) the computer 134 then controls the optical source to sweep the wavelength of the optical signal 108 over a desired range; e) the voltmeter 150 measures the voltage of the selected one of the output signals 122 at each step of the sweep in wavelength; f) when the sweep ends, the measured voltages for the selected one of the output signals 122 are output as the test data 132; g) a determination is then made as to whether all of the output signals 122 have been processed; h) if not, then the process returns to step b) for the selection of a next one of the output signals 122 and the steps c)-g) are repeated as needed until all of the output signals 122 have been processed.

Figure 10:
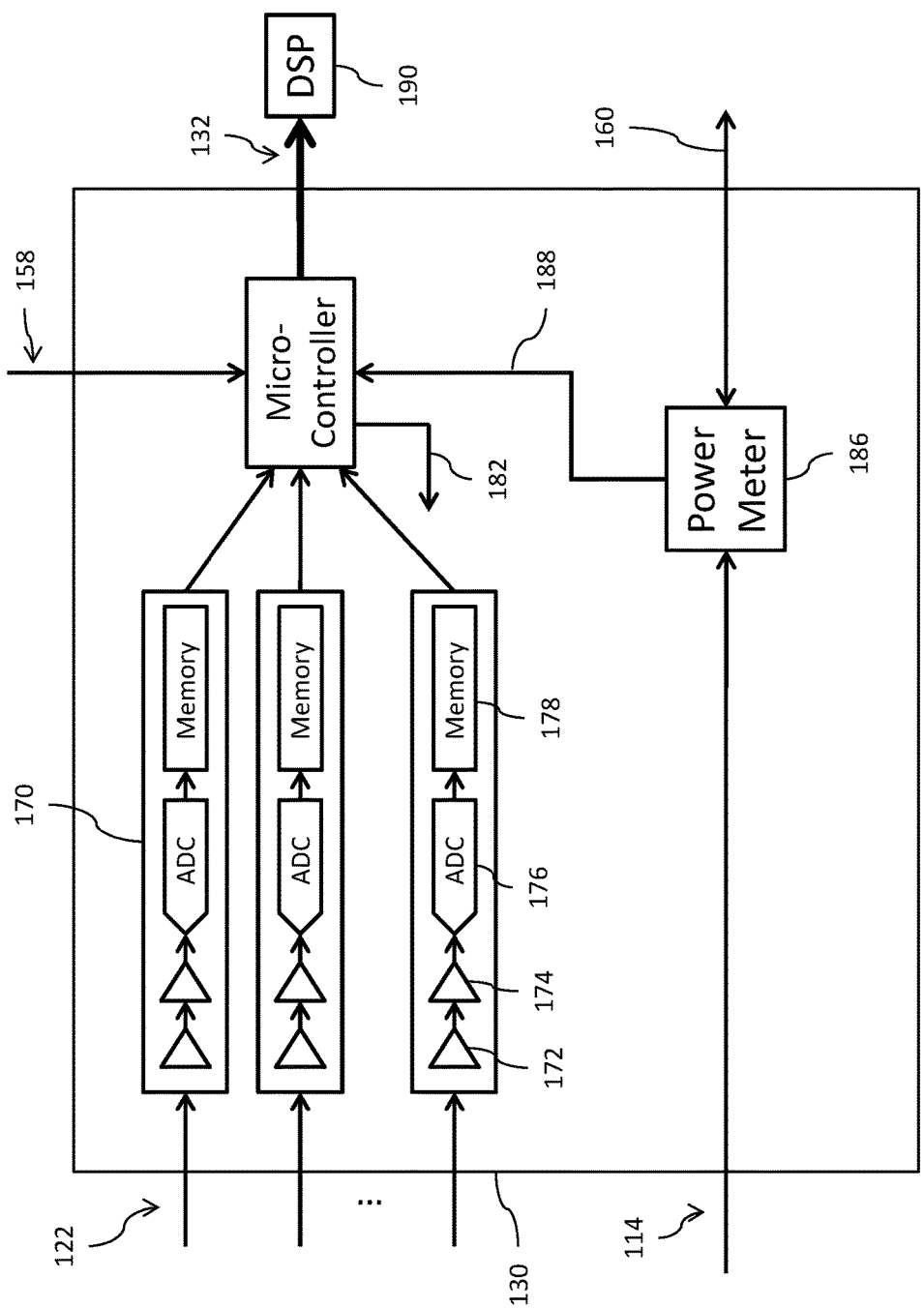
FIG. 10 is a block diagram of the signal acquisition system.

Reference is now made to FIG. 10 showing a block diagram of an alternative embodiment of the signal acquisition system 130. The signal acquisition system 130 of FIG. 10 includes a plurality of signal conversion circuits 170 equal in number to the number of photocurrent signals of the output signals 122 produced by the probe card 120. Each signal conversion circuit 170 includes a logarithmic amplifier 172, coupled in series with a programmable gain amplifier 174, coupled in series with an analog to digital converter (ADC) circuit 176, coupled in series with a digital memory 178. The logarithmic amplifier 172 has an input coupled to receive one of the photocurrent signals, and digital data corresponding to the amplified and converted photocurrent signal is stored in the memory 178.

A power meter 186 is coupled to the optical input to receive the optical reference signal 114. The power meter 186 functions to capture the wavelength of the optical reference signal 114, sense a change in wavelength of the optical reference signal 114 during a sweep and assert a trigger signal 188 in response to each new wavelength. The power meter 186 further outputs data on bus 160 to the computer 134 specifying each wavelength of the optical reference signal 114 during the sweep.

The trigger signal 188 is applied to an input of a microcontroller 180. The microcontroller 180 further includes an input coupled to an output of the digital memory 178 of each signal conversion circuit 170. In response to assertion of the trigger signal 188, the microcontroller 180 operates to read the digital data from the digital memory 178 of each signal conversion circuit 170 and generate the test data 132 at the current optical signal wavelength for output to the computer 134. The microcontroller 180 further functions to command storage of the test data 132 for each wavelength of the optical reference signal 114 during the sweep in response to assertion of the trigger signal 188. The microcontroller 180 also functions to generate control signaling 182 applied to each signal conversion circuit 170 for the purpose of controlling gain of the programmable gain amplifier 174 as well as control timing of signal sampling/conversion operations performed by the ADC circuit 176.

Operation of the opto-electrical test measurement system 100 using the signal acquisition system 130 of FIG. 10 is as follows: a) the test equipment is coupled to the wafer and in particular to the reference circuit 20 (this involves optically coupling the optical testing signal 112 to the optical coupler 24 at the optical input 102, and electrically coupling the probe card 120 to the plurality of electrical outputs 104(1)-104(m); proper optical alignment is important); b) the optical source 106 operates to sweep the wavelength of the optical signal 108 over a plurality of discrete wavelength steps; c) at each step of the wavelength sweep as detected by the power meter 186 through monitoring of change in wavelength of the optical reference signal 114, the trigger signal 188 is asserted; d) each signal conversion circuit 170 operates, in response to the control signaling 182, to convert the received output signal 122 to corresponding digital data stored in the memory 178 for the current step in wavelength; e) the microcontroller 180 responds to the asserted trigger signal 188 by reading (for example, in parallel) the digital data from the signal conversion circuits 170 and outputting (for example, in serial) the read digital data for that wavelength to the computer 134; f) the power meter 186 sends data comprising the wavelength of the monitored optical reference signal 114 for the current step to the computer 134; and g) the process ends when the optical source 106 completes its sweep of the wavelength of the optical signal 108 and data for each discrete step in the wavelength sweep has been collected and sent to the computer 134.

Although the implementation of FIG. 10 uses a logarithmic amplifier 172 coupled in series with a programmable gain amplifier 174 to analog process the analog photocurrent signals of the output signals 122, it will be understood that this is just example of the analog signal processing that is performed. Alternatively, other types of amplification and analog signal processing, such as through the use of a transimpedance amplifier, that are compatible with subsequent ADC processing could be used.

A programmable processor, such as a digital signal processor (DSP) 190, could be provided to post process the read digital data and generate the test data.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

The invention claimed is:

1. A method for testing an optical testing circuit on a wafer, wherein said optical testing circuit includes: an optical input configured to receive an optical test signal and a plurality of photodetectors configured to generate a corresponding plurality of electrical signals in response to optical processing of said optical test signal through the optical testing circuit, said method comprising:
   applying the optical test signal to the optical input with a sweep in wavelength including a plurality of steps;
   simultaneously sensing the plurality of electrical signals at each step of the sweep in wavelength;
   generating test data for the simultaneously sensed plurality of electrical signals at each step of the sweep in wavelength;
   storing the test data at each step of the sweep in wavelength;
   sensing a change in wavelength of the optical test signal; and
   in response to the sensed change in wavelength of the optical test signal, outputting the stored test data.

2. The method of claim 1, wherein generating test data comprises, for each individual electrical signal of the plurality of electrical signals that is simultaneously sensed, converting the individual electrical signal to a digital signal.

3. The method of claim 2, wherein storing the test data comprises, for each individual electrical signal of the plurality of electrical signals that is simultaneously sensed, storing the digital signal in a memory.

4. The method of claim 3, wherein outputting comprises reading the stored digital signal from each memory.

5. The method of claim 4, further comprising generating a trigger signal in response to the sensed change in wavelength, and wherein reading is performed in response to said trigger signal.

6. The method of claim 1, wherein optical processing of said optical test signal through the optical testing circuit comprises passing a signal derived from said optical test signal through at least one optical device under test (DUT) circuit.

7. The method of claim 1, further comprising generating a trigger signal in response to the sensed change in wavelength, and wherein outputting is performed in response to said trigger signal.

8. The method of claim 1, further comprising controlling a gain of each electrical signal of the plurality of electrical signals at each step of the sweep in wavelength.

9. The method of claim 1, wherein outputting further comprises providing, with each output of stored test data, an identification of the step in the sweep in wavelength of the optical test signal that corresponds to the simultaneously sensed plurality of electrical signals from which the stored test data is generated.

10. The method of claim 9, wherein the identification of the step is an identification of the wavelength for that step.

11. A method for testing an optical testing circuit on a wafer, wherein said optical testing circuit includes: an optical input configured to receive an optical test signal and a plurality of photodetectors configured to generate a corresponding plurality of electrical signals in response to optical processing of said optical test signal through the optical testing circuit, said method comprising:
   sequentially selecting an electrical signal from the plurality of electrical signals; and
   for each selected electrical signal, performing a process as follows:
      sweeping the wavelength of the optical test signal;
      sensing the selected electrical signal;
      generating test data from the selected electrical signal over the sweep in wavelength of the optical test signal;
      determining whether all electrical signals of the plurality of electrical signals have been selected; and
      if not, then changing the selected electrical signal and repeating the process.

12. A method for testing, comprising:
   applying an optical test signal to an optical input with a sweep in wavelength including a plurality of steps;
   passing a signal derived from said optical test signal through at least one optical device under test (DUT) circuit;
   photodetecting the optical test signal and a signal output from the DUT circuit to generate a corresponding plurality of electrical signals; and
   for each step of the sweep in wavelength:
      simultaneously sensing the plurality of electrical signals;
      generating test data for the simultaneously sensed plurality of electrical signals;
      storing the test data;
      detecting a change in the step of the sweep in wavelength; and
      outputting the stored test data.

13. The method of claim 12, wherein generating test data comprises converting each electrical signal of said plurality of electrical signals to a digital signal.

14. The method of claim 13, wherein storing the test data comprises storing the digital signal in a memory.

15. The method of claim 14, wherein outputting comprises reading the stored digital signal from the memory.

16. The method of claim 12, further comprising controlling a gain of each electrical signal of the plurality of electrical signals at each step of the sweep in wavelength.

17. The method of claim 12, wherein outputting further comprises providing, with each output of stored test data, an identification of the step in the sweep in wavelength of the optical test signal that corresponds to the simultaneously sensed plurality of electrical signals from which the stored test data is generated.

18. The method of claim 17, wherein the identification of the step is an identification of the wavelength for that step.

19. A method for testing, comprising:

applying an optical test signal to an optical input;

passing a signal derived from said optical test signal through at least one optical device under test (DUT) circuit;

photodetecting the optical test signal and a signal output from the DUT circuit to generate a corresponding plurality of electrical signals;

sequentially selecting an electrical signal from the plurality of electrical signals; and for each selected electrical signal, performing a process as follows:

sweeping the wavelength of the optical test signal in a plurality of steps;

sensing the selected electrical signal;

generating test data from the selected electrical signal over the sweep in wavelength of the optical test signal;

determining whether all electrical signals of the plurality of electrical signals have been selected; and if not, then changing the selected electrical signal and repeating the process.

* * * * *